US010572060B2

(12) United States Patent
Lee et al.

(10) Patent No.: US 10,572,060 B2
(45) Date of Patent: Feb. 25, 2020

(54) SENSING UNIT INCLUDING TOUCH ELECTRODE AND DISPLAY DEVICE USING THE SAME

(71) Applicant: LG Display Co., Ltd., Seoul (KR)

(72) Inventors: Yangsik Lee, Paju-si (KR); KwangJo Hwang, Paju-si (KR); JiHyun Jung, Paju-si (KR); DeukSu Lee, Paju-si (KR); SuChang An, Paju-si (KR); JaeGyun Lee, Paju-si (KR); Ruda Rhe, Paju-si (KR)

(73) Assignee: LG Display Co., Ltd., Seoul (KR)

(*) Notice: Subject to any disclaimer, the term of this patent is extended or adjusted under 35 U.S.C. 154(b) by 228 days.

(21) Appl. No.: 15/813,040

(22) Filed: Nov. 14, 2017

(65) Prior Publication Data

US 2018/0348948 A1    Dec. 6, 2018

(30) Foreign Application Priority Data

Jun. 1, 2017    (KR) .................. 10-2017-0068431

(51) Int. Cl.
*G06F 3/041*  (2006.01)
*G06F 3/044*  (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC .... G06F 3/0416; G06F 3/0448; G06F 3/0443; G06F 3/0412; G06F 3/044;
(Continued)

(56) References Cited

U.S. PATENT DOCUMENTS

2009/0213090 A1*   8/2009   Mamba .................. G06F 3/044
                                              345/174
2011/0102370 A1    5/2011   Kono et al.
(Continued)

FOREIGN PATENT DOCUMENTS

EP         1418491 A2      5/2004
JP       2010-198586 A     9/2010
(Continued)

OTHER PUBLICATIONS

Japanese Office Action (with English concise explanation of relevance), Japanese Patent Application No. 2017-248977, dated Feb. 12, 2019, 7 pages.
(Continued)

*Primary Examiner* — Brent D Castiaux
(74) *Attorney, Agent, or Firm* — Fenwick & West LLP

(57) ABSTRACT

An embodiment disclosed herein provides a sensing unit that senses a touch corresponding to a capacitance formed by a first electrode and a second electrode. The first electrode includes a first driving electrode pattern and a first sensing electrode pattern, the first sensing electrode pattern being disposed in the first driving electrode pattern, the second electrode includes a second driving electrode pattern and a second sensing electrode pattern, the second driving electrode pattern being disposed in the second sensing electrode pattern. A first capacitive coupling is formed corresponding to the first touch electrode and the first sensing electrode, a second capacitive coupling is formed corresponding to the second driving electrode and the second sensing electrode, and a third capacitive coupling is formed corresponding to the first touch electrode and the second sensing electrode.

24 Claims, 10 Drawing Sheets

(51) Int. Cl.
*H01L 27/32* (2006.01)
*H01L 51/52* (2006.01)

(52) U.S. Cl.
CPC .......... *G06F 3/0443* (2019.05); *G06F 3/0448* (2019.05); *H01L 27/323* (2013.01); *H01L 51/5253* (2013.01); *G06F 3/04164* (2019.05); *G06F 2203/04111* (2013.01); *G06F 2203/04112* (2013.01); *H01L 27/322* (2013.01); *H01L 27/3244* (2013.01); *H01L 51/5284* (2013.01)

(58) Field of Classification Search
CPC ....... G06F 3/04164; G06F 2203/04111; G06F 2203/04112; H01L 51/5253; H01L 51/5284; H01L 27/323; H01L 27/322; H01L 27/3244
See application file for complete search history.

(56) References Cited

U.S. PATENT DOCUMENTS

| | | | |
|---|---|---|---|
| 2013/0264095 A1* | 10/2013 | Lai | H01B 1/00 174/126.1 |
| 2013/0307789 A1 | 11/2013 | Karamath et al. | |
| 2014/0132853 A1 | 5/2014 | Lin | |
| 2014/0253499 A1* | 9/2014 | Lee | G06F 3/044 345/174 |
| 2015/0015803 A1* | 1/2015 | Wang | G06F 3/044 349/12 |
| 2016/0154507 A1* | 6/2016 | Bharathan | G06F 3/011 345/174 |
| 2016/0162011 A1 | 6/2016 | Verma et al. | |
| 2016/0162101 A1 | 6/2016 | Pant et al. | |
| 2016/0162102 A1 | 6/2016 | Shahparnia et al. | |
| 2016/0170524 A1* | 6/2016 | Kim | G06F 3/044 345/174 |
| 2016/0179260 A1* | 6/2016 | Ham | G06F 3/0412 345/173 |
| 2017/0090634 A1 | 3/2017 | Yang et al. | |
| 2018/0329537 A1 | 11/2018 | Gunji | |

FOREIGN PATENT DOCUMENTS

| | | | |
|---|---|---|---|
| JP | 2010198586 A | * | 9/2010 |
| JP | 2013-222384 A | | 10/2013 |
| JP | 2018-190331 A | | 11/2018 |
| TW | 201541311 A | | 11/2015 |
| TW | 201716966 A | | 5/2017 |
| TW | M542182 U | | 5/2017 |

OTHER PUBLICATIONS

Extended European Search Report, European Patent Application No. 17210232.9, dated Jul. 4, 2018, 11 pages.
Taiwanese Office Action, Taiwan Intellectual Property Office Patent Application No. 106146578, dated Jun. 8, 2018, 10 pages.

* cited by examiner

SENSING UNIT INCLUDING TOUCH ELECTRODE AND DISPLAY DEVICE USING THE SAME

CROSS REFERENCE TO RELATED APPLICATION

This application claims priority from Korean Patent Application No. 10-2017-0068431, filed on Jun. 1, 2017, which is hereby incorporated by reference in its entirety.

BACKGROUND

1. Field of Technology

Embodiments disclosed herein relate to a sensing unit including a touch electrode, and a display device using the sensing unit.

2. Description of the Prior Art

As the information-oriented society has been developed, requests for various types of display devices for displaying images have increased, and various kinds of display devices, such as a liquid crystal display (LCD) device, a plasma display device, and an organic light emitting display (OLED) device, have been utilized.

In addition, a display device is capable of being operated by receiving a user's command through various input devices, such as a keyboard or a mouse. A touch panel has been developed as an input device for a display device, in which the touch panel allows a user's command to be intuitively and conveniently input by touching the screen of the display device. In general, the touch panel may be disposed on the screen of the display device, and the display device may receive the input of a user's command when the user touches a specific point on the screen of the display device.

In addition, touch panels may be classified into a capacitance-type touch panel, a resistive film-type touch panel, an ultrasonic-type touch panel, an infrared-type touch panel, and the like, and the capacitance-type touch panel is widely used for various reasons including the convenience of use. In addition, the capacitance-type touch panel senses a touch using a capacitance sensed corresponding to a touch electrode, and may be classified into a mutual-capacitance-type touch panel and a self-capacitance-type touch panel.

The touch panel is mounted on a display device, in which an aperture ratio may be lowered by the touch panel, and as a result, the brightness of the display device may deteriorate. In order to solve this problem, a touch electrode is patterned to increase an area through which light is transmitted in the touch panel. In this case, the magnitude of capacitance may be reduced, and as a result touch sensitivity may deteriorate.

SUMMARY

Embodiments disclosed herein provide a sensing unit including a touch electrode, of which the touch sensitivity does not deteriorate, and a display device using the sensing unit.

Embodiments disclosed herein provide a sensing unit, which prevents a touch signal from being distorted, and a display device using the sensing unit.

In an aspect, embodiments disclosed herein provide a sensing unit that senses touch, the sensing unit comprising: a first driving electrode pattern; a first sensing electrode pattern surrounded by the first driving electrode pattern, the first sensing electrode pattern disposed in a same layer within the sensing unit as the first driving electrode pattern; a second sensing electrode pattern; and a second driving electrode pattern surrounded by the second sensing electrode pattern, the second driving electrode pattern disposed in a same layer within the sensing unit as the second sensing electrode pattern; wherein a touch driving signal is provided to the first driving electrode pattern and the second driving electrode pattern for sensing touch on the sensing unit, and wherein a touch sensing signal indicative of touch on the sensing unit is received from the first sensing electrode pattern and the second sensing electrode pattern.

In another aspect, embodiments disclosed herein provide a sensing unit comprising: a first outer electrode; a first inner electrode surrounded by the first outer electrode, the first inner electrode pattern disposed in a same layer within the sensing unit than the first outer electrode; a second outer electrode; a second inner electrode surrounded by the second outer electrode, the second inner electrode pattern disposed in a same layer within the sensing unit than the second outer electrode; a third outer electrode; a third inner electrode surrounded by the third outer electrode, the third inner electrode pattern disposed in a same layer within the sensing unit than the third outer electrode; a fourth outer electrode; a fourth inner electrode surrounded by the fourth outer electrode, the fourth inner electrode pattern disposed in a same layer within the sensing unit than the fourth outer electrode, a first connection part connected to the first outer electrode, the third outer electrode, the second inner electrode, and the fourth inner electrode, the first connection part electrically connecting together the first outer electrode, the third outer electrode, the second inner electrode, and the fourth inner electrode; and a second connection part connected to the first inner electrode, the third inner electrode, the second outer electrode, and the fourth outer electrode, the second connection part electrically connecting together the first inner electrode, the third inner electrode, the second outer electrode, and the fourth outer electrode; wherein a touch driving signal is provided to the first outer electrode, the third outer electrode, the second inner electrode, and the fourth inner electrode for sensing touch on the sensing unit, and wherein a touch sensing signal indicative of touch on the sensing unit is received from the first inner electrode, the third inner electrode, the second outer electrode, and the fourth outer electrode.

In another aspect, embodiments disclosed herein provide a display device comprising: a display panel; an encapsulation layer on the display panel; a sensing unit mounted on the encapsulation layer, wherein the sensing unit includes: a first driving electrode pattern; a first sensing electrode pattern surrounded by the first driving electrode pattern, the first sensing electrode pattern disposed in a same layer within the sensing unit than the first driving electrode pattern; and a second sensing electrode pattern; second driving electrode pattern surrounded by the second sensing electrode pattern, the second driving electrode pattern disposed in a same layer within the sensing unit that the second sensing electrode pattern; wherein a touch driving signal is provided to the first driving electrode pattern and the second driving electrode pattern, and wherein a touch sensing signal indicative of touch on the sensing unit is received from the first sensing electrode pattern and the second sensing electrode pattern.

In another aspect, embodiments disclosed herein provide a display device comprising: a display panel; an encapsulation layer on the display panel; and a sensing unit mounted on the encapsulation layer the sensing unit including: a first inner electrode surrounded by the first outer electrode, the first inner electrode pattern disposed in a same layer within the sensing unit than the first outer electrode; a second outer electrode; a second inner electrode surrounded by the second outer electrode, the second inner electrode pattern disposed in a same layer within the sensing unit than the second outer electrode; a third outer electrode; a third inner electrode surrounded by the third outer electrode, the third inner electrode pattern disposed in a same layer within the sensing unit than the third outer electrode; a fourth outer electrode; a fourth inner electrode surrounded by the fourth outer electrode, the fourth inner electrode pattern disposed in a different layer within the sensing unit than the fourth outer electrode, a first connection part connected to the first outer electrode, the third outer electrode, the second inner electrode, and the fourth inner electrode, the first connection part electrically connecting together the first outer electrode, the third outer electrode, the second inner electrode, and the fourth inner electrode; and a second connection part connected to the first inner electrode, the third inner electrode, the second outer electrode, and the fourth outer electrode, the second connection part electrically connecting together the first inner electrode, the third inner electrode, the second outer electrode, and the fourth outer electrode; wherein a touch driving signal is provided to the first outer electrode, the third outer electrode, the second inner electrode, and the fourth inner electrode for sensing touch on the sensing unit, and wherein a touch sensing signal indicative of touch on the sensing unit is received from the first inner electrode, the third inner electrode, the second outer electrode, and the fourth outer electrode.

In another aspect, embodiments disclosed herein provide a sensing unit that senses a touch, the sensing unit comprising: a first driving electrode pattern; a first sensing electrode pattern overlapped by the first driving electrode pattern, the first sensing electrode pattern disposed in a different layer within the sensing unit than the first driving electrode pattern; a second sensing electrode pattern; and a second driving electrode pattern overlapped by the second sensing electrode pattern, the second driving electrode pattern disposed in a different layer within the sensing unit that the second sensing electrode pattern; wherein a touch driving signal is provided to the first driving electrode pattern and the second driving electrode pattern for sensing touch on the sensing unit, and wherein a touch sensing signal indicative of touch on the sensing unit is received from the first sensing electrode pattern and the second sensing electrode pattern.

In another aspect, embodiments disclosed herein provide a display device comprising: a display panel; an encapsulation layer on the display panel; and a sensing unit mounted on the encapsulation layer, wherein the sensing unit includes: a first driving electrode pattern; a first sensing electrode pattern overlapped by the first driving electrode pattern, the first sensing electrode pattern disposed in a different layer within the sensing unit than the first driving electrode pattern; and a second sensing electrode pattern; second driving electrode pattern including overlapped by the second sensing electrode pattern, the second driving electrode pattern disposed in a different layer within the sensing unit that the second sensing electrode pattern; wherein a touch driving signal is provided to the first driving electrode pattern and the second driving electrode pattern, and wherein a touch sensing signal indicative of touch on the sensing unit is received from the first sensing electrode pattern and the second sensing electrode pattern.

According to embodiments disclosed herein, it is possible to provide a sensing unit including a touch electrode, of which the touch sensitivity does not deteriorate, and a display device using the sensing unit.

According to embodiments disclosed herein, it is possible to provide a sensing unit, which prevents a touch signal from being distorted, and a display device using the sensing unit.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION

Figure 1:
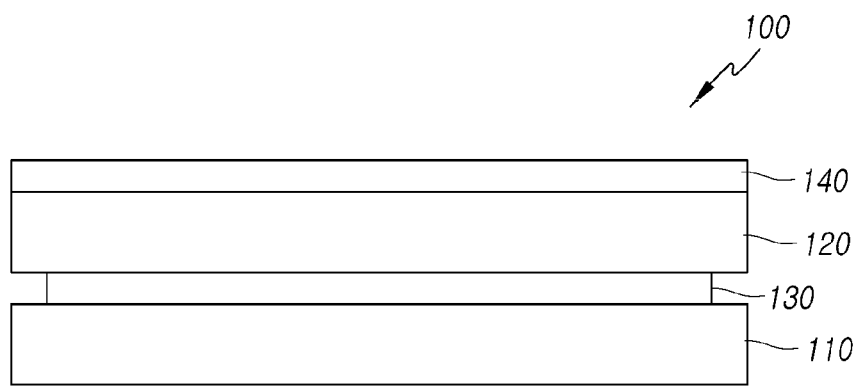
FIG. 1 is a cross-sectional view illustrating an embodiment of a display device including a sensing unit according to the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a cross-sectional view illustrating an embodiment of a display device including a sensing unit according to the present disclosure.

Referring to FIG. 1, a display device 100 includes a first substrate 110, an organic film 130 that is deposited on the first substrate 110 to emit light, and an encapsulation layer 120 that protects the organic film 130 deposited on the first substrate 110. The encapsulation layer 120 is bonded to the first substrate 110 by a sealing material (not illustrated) to seal the organic film 130, so that the encapsulation layer 120 may be referred to as a sealing substrate. Although not shown, a cathode electrode is between the encapsulation layer 120 and the organic film 130.

The first substrate 110 may include a plurality of pixel circuits (not illustrated) and the organic film connected to the pixel circuits. Each pixel circuit may be formed with elements, such as a plurality of transistors (not illustrated) and a capacitor, and may selectively transfer an electric current to the organic film 130 so that light can be emitted from the organic film 130. However, without being limited thereto, a plurality of pixel circuits may be formed on the first substrate 110. In addition, the first substrate 110 may be made of an insulating material or a metallic material. The organic film 130 may be formed to correspond to a light emitting region that emits light.

The encapsulation layer 120 may be oppositely bonded to the first substrate 110 so as to protect the organic film 130 from moisture or a foreign matter. The encapsulation layer 120 may have a thickness of 5 μm or more, and may be made of an insulating material. The sensing unit 140 that senses a touch position may be disposed on the encapsulation layer 120. Here, the sensing unit 140 may include a separate touch panel that is distinguished from a separate display device. In addition, the sensing unit 140 may include a touch electrode formed on the encapsulation layer 120. That is, the sensing unit 140 includes not only a separate touch panel formed on the encapsulation layer 120 so as to sense a touch, but also a touch electrode formed on the encapsulation layer 120 and mounted on the organic light emitting diode (OLED) display device 100. Therefore, it is possible to implement the OLED display device 100 to have a reduced thickness. However, the position of the touch electrode is not limited thereto.

The organic film 130 may receive a driving current from each pixel circuit so as to emit light. The organic film 130 may be formed independently for each pixel. Then, a plurality of light emitting regions that emits light owing to the organic film may be disposed on the first substrate 110. In addition, the organic film 130 may be a plurality of organic compound layers of an organic light emitting diode. The organic-light emitting diode includes an anode electrode, a cathode electrode, and an organic compound layer formed therebetween. The organic compound layer may include a hole injection layer (HIL), a hole transport layer (HTL), an emission layer (EML), an electron transport layer (En), and an electron injection layer (EIL). When a driving voltage is applied to the anode electrode and the cathode electrode by the operation of the pixel circuit, holes, which have passed through the HTL, and the electrons, which have passed through the En, move to the EML thereby forming excitons and as a result, generating visible light in the EML.

Here, the display device is illustrated as an OLED display device, but may be, but not exclusively, a liquid crystal display device or a Plasma Display Panel (PDP).

Figure 2:
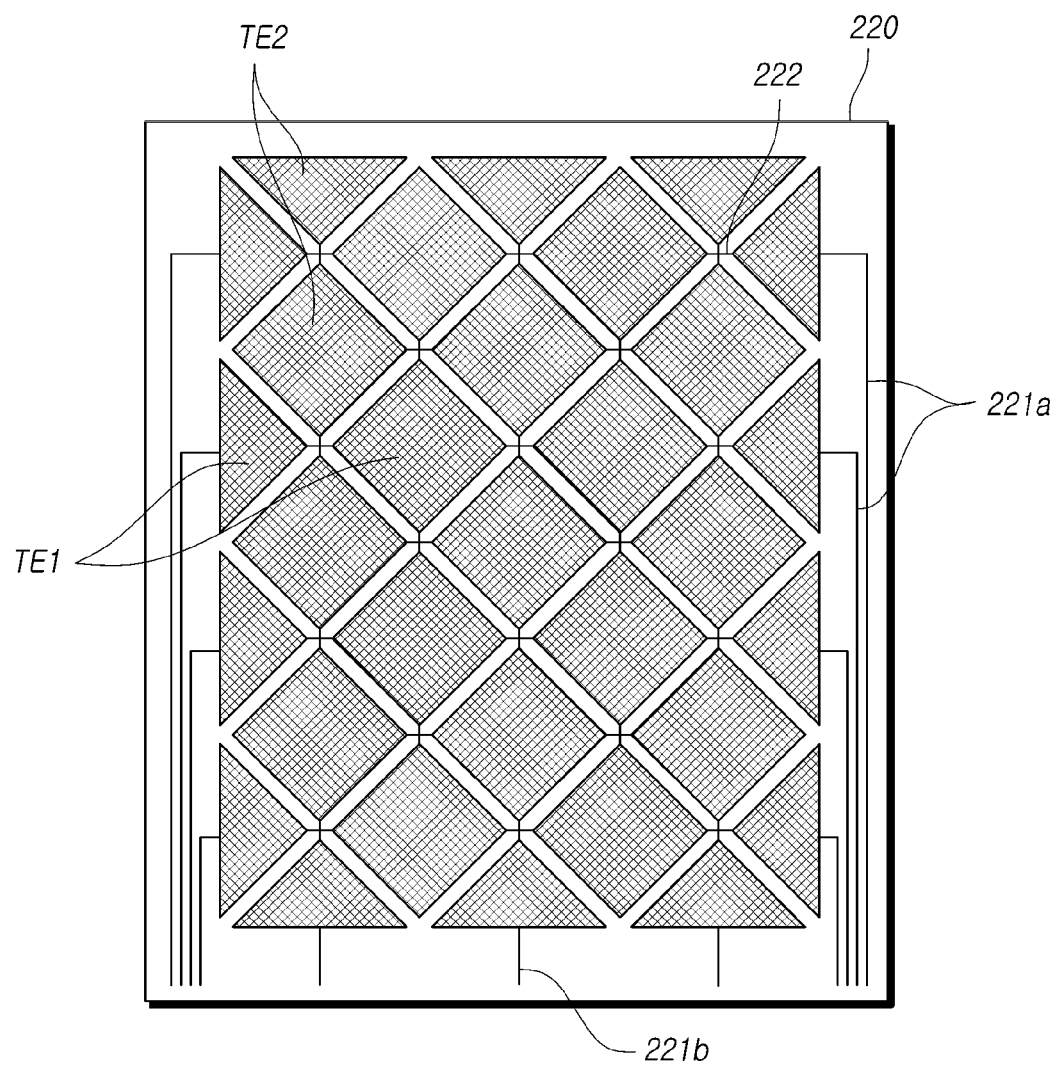
FIG. 2 is a plan view illustrating an embodiment of a sensing unit employed in the display device illustrated in FIG. 1 according to the present disclosure.

FIG. 2 is a plan view illustrating an embodiment of a sensing unit employed in the display device illustrated in FIG. 1.

Referring to FIG. 2, the sensing unit 220 may include a plurality of first electrodes TE1 and a plurality of second electrodes TE2. The plurality of first electrodes TE1 may be connected in the horizontal direction by the connection parts 222 so as to form a plurality of electrode rows, and the plurality of second electrodes TE2 may be connected in the vertical direction by the connection parts 222 so as to form a plurality of electrode columns. Although the plurality of electrodes is arranged in a 4×3 form here, the present invention is not limited thereto.

Each connection part 222 may connect one first electrode TE1 to the other first electrodes in the same row, and may connect one second electrode TE2 to the other second electrodes in the same column. In addition, the plurality of electrodes may include a driving electrode configured to transmit a touch-driving signal and a sensing electrode configured to transmit a touch-sensing signal corresponding to the touch-driving signal. The connection parts 222 intersect each other. In order to prevent the first electrodes TE1 and the second electrodes TE2 from being directly connected to each other, the connection parts, which connect the first electrodes TE1, are formed in the same layer as the first electrodes TE1 and the second electrodes TE2, so that the first electrodes TE1 are directly connected to each other. The connection parts 222, which connect the second electrodes TE2, are formed in a layer different from that of the first electrodes TE1 and the second electrodes TE2 and are connected through via holes, so that the second electrodes TE2 are connected to the connection parts 222 through the via holes so as to be indirectly connected to each other.

In addition, the first electrodes TE1 and the second electrodes TE2 may be formed by patterning a conductive metallic layer. The first electrodes TE1 and the second electrodes TE2 may be formed of a transparent material, such as indium tin oxide (ITO). In addition, the patterned first electrodes TE1 and second electrodes TE2 may include a plurality of electrode patterns formed in the form of a mesh, and a plurality of electrode patterns intersects each other, so that the first electrodes TE1 and the second electrodes TE2 may include a plurality of openings. Light, which is emitted from the display device through the first electrodes TE1 and the second electrodes TE2 made of the ITO electrodes or the plurality of openings included in the first electrodes TE1 and the second electrodes TE2, may be transmitted through the first electrodes TE1 and the second electrodes TE2, or may be emitted to the outside through the plurality of openings.

The electrode patterns of the first electrodes TE1 and the second electrodes TE2, each of which is formed in the form of a mesh, may be referred to as touch electrode wiring. In addition, the first electrodes TE1 and the second electrodes TE2 may be connected to driving lines 221a that cause a driving signal, which drives the first electrodes TE1 and the second electrodes TE2, to be applied to a touch electrode, and sensing lines 221b that cause a sensing signal, which is generated to correspond to the touch sensed by the touch electrode, to be transmitted. The driving lines 221a and the sensing lines 221b may be referred to as touch wiring.

In this case, the first electrodes TE1 and the second electrodes TE2 are not directly connected to each other, so that one first electrode TE1 and one second electrode TE2 form one capacitive coupling. However, since the magnitude of the capacitance is not large, the touch sensitivity may be insufficient.

Figure 3:
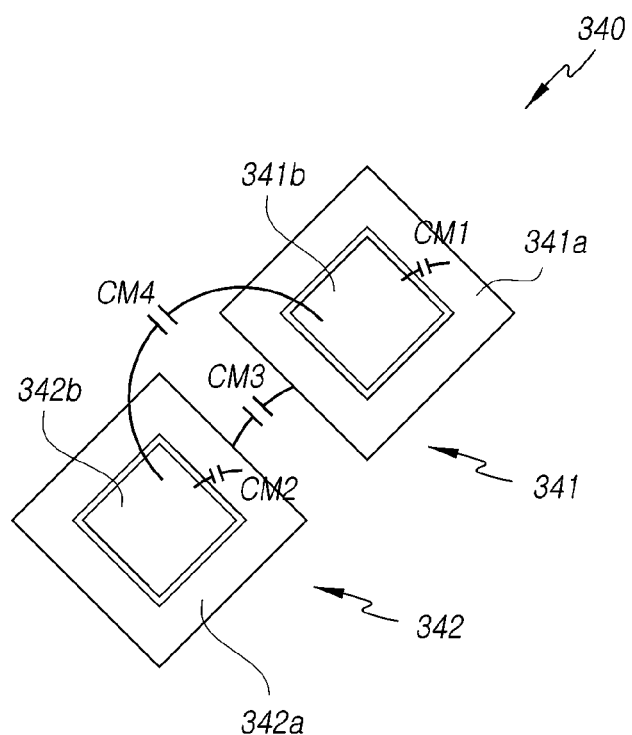
FIG. 3 is a plan view illustrating a first embodiment of a sensing unit including first electrodes and second electrodes according to the present disclosure.

FIG. 3 is a plan view illustrating a first embodiment of a sensing unit including the first electrodes and the second electrodes according to the present disclosure.

Referring to FIG. 3, the sensing unit 220 may include a first electrode 341 and a second electrode 342, and may detect a touch corresponding to a capacitance formed by the first electrode 341 and the second electrode 342. The first electrode 341 may include a first driving electrode pattern 341a and a first sensing electrode pattern 341b, and the first sensing electrode pattern 341b may be disposed within the first driving electrode pattern 341a. The second electrode 342 may include a second sensing electrode pattern 342a and a second driving electrode pattern 342b, and the second driving electrode pattern 342b may be disposed within the second sensing electrode pattern 342a. That is, one sensing electrode pattern may be disposed within one touch electrode pattern, and another touch electrode pattern may be disposed within another sensing electrode pattern. Here, the description "one electrode pattern is disposed within another electrode pattern" means that one electrode pattern is disposed within another electrode pattern in one projection plane according to one embodiment. Accordingly, the touch electrode pattern and the sensing electrode pattern may be disposed on different layers, or the touch electrode pattern and the sensing electrode pattern may be disposed on the same layer. The description "the touch electrode pattern and the sensing electrode pattern are disposed on different layers" means that an insulating film is disposed between the touch electrode pattern and the sensing electrode pattern according to one embodiment.

When one driving electrode pattern is formed in the first electrode and one sensing electrode pattern is formed in the second electrode as illustrated in FIG. 2, one capacitive coupling is formed between the first electrode and the second electrode, so that a capacitive coupling is generated in only one path.

However, the first electrode 341 includes the first driving electrode pattern 341a and the first sensing electrode pattern 341b, and the second electrode 342 includes the second driving electrode pattern 342b and the second sensing electrode pattern 342a. Thus, between the first electrode 341 and the second electrode 342, a first capacitive coupling CM1 is formed corresponding to the first driving electrode pattern 341a and the first sensing electrode pattern 341b, a second capacitive coupling CM2 is formed corresponding to the second driving electrode pattern 342b and the second sensing electrode pattern 342a, and a third capacitive coupling CM3 is formed corresponding to the first driving electrode pattern 341a and the second sensing electrode pattern 342a. In addition, a fourth capacitive coupling CM4 may be formed corresponding to the first sensing electrode pattern 341b and the second driving electrode pattern 342b.

That is, the first electrode 341 and the second electrode 342 are formed to respectively include a touch driving electrode and a touch sensing electrode, which are spaced apart from each other, thereby increasing the number of paths in which the capacitive coupling is formed, and as a result, the magnitude of the capacitance can be increased so that the touch sensitivity of the sensing unit can be improved.

In addition, the first driving electrode pattern 341a and the second driving electrode pattern 342b are connected to each other through a first connection part (not illustrated), and the first sensing electrode pattern 341b and the second sensing electrode pattern 342a (not illustrated) may be connected to each other through a second connection part (not illustrated) that is formed in a layer different from that of the first connection part. Here, the description "the second connection part is formed in a layer different from that of the first connection part" may mean that an insulating film may be disposed between the first connection part and the second connection part such that the first connection part and the second connection part are disposed on the top surface and the bottom surface of the insulating film (not illustrated), respectively according to one embodiment. The first connection part and the second connection part may not be connected to each other due to the presence of the insulating film.

Here, the sensing unit is illustrated as including a first electrode and a second electrode, but is not limited thereto. As illustrated in FIG. 2, a plurality of electrodes is arranged in the sensing unit, and the sensing unit may include a driving signal line configured to transmit a driving signal to an electrode and connected to the first driving electrode pattern 341a and the first sensing electrode pattern 341b included in the first electrode, and a sensing signal line configured to transmit a sensing signal and connected to the second driving electrode pattern 342b and the second sensing electrode pattern 342a included in the second electrode.

Figure 4:
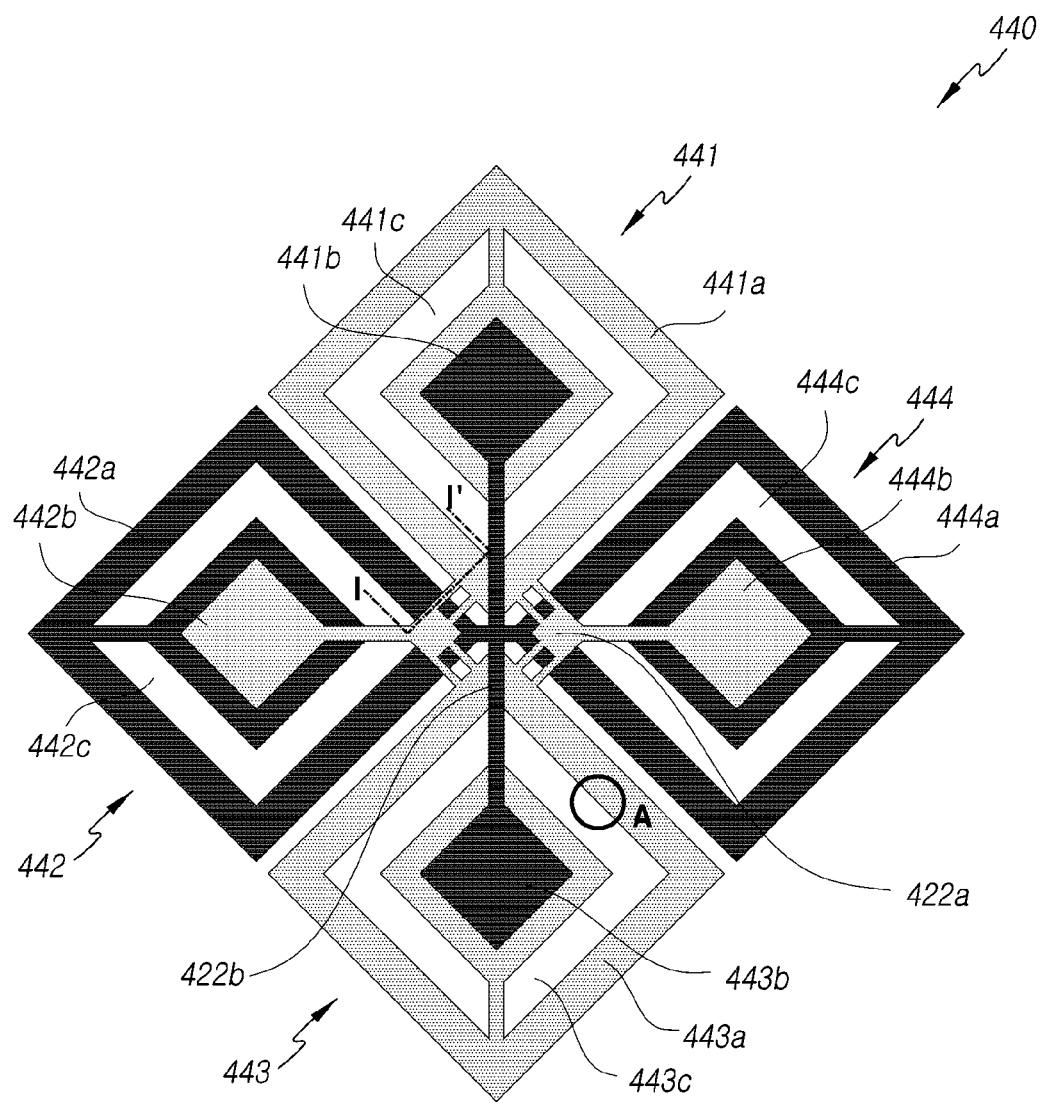
FIG. 4 is a plan view illustrating a second embodiment of a sensing unit including first electrodes and second electrodes according to the present disclosure.

FIG. 4 is a plan view illustrating a second embodiment of a sensing unit including first electrodes and second electrodes according to the present disclosure.

Referring to FIG. 4, the sensing unit 440 may include first to fourth electrodes 441 to 444.

The first electrode 441 may include a first outer electrode 441a and a first inner electrode 441b, the second electrode 442 may include a second outer electrode 442a and a second inner electrode 442b, the third electrode 443 may include a third outer electrode 443a and a third inner electrode 443b, and the fourth electrode 444 may include a fourth outer electrode 444a and a fourth inner electrode 444b.

The first outer electrode 441a, the third outer electrode 443a, the second inner electrode 442b, and the fourth inner electrode 444b may be connected to each other through a first connection part 422a, and the first inner electrode 441b, the third inner electrode 443b, the second outer electrode 442a, and the fourth outer electrode 444a may be disposed in a layer different from the first connection part 422a and may be connected to each other through a second connection part 422b. Accordingly, between the first electrode 441 and the second electrode 442, the first outer electrode 441a and the first inner electrode 441b, the second outer electrode 442a and the second inner electrode 442b, the first outer electrode 441b and the second outer electrode 442a, or the first inner electrode 441b and the second inner electrode 442b are not connected to each other through the first connection part 422a or the second connection part 422b, so that a capacitive coupling can be formed therebetween. Between the first electrode 441 and the fourth electrode 444, the first outer electrode 441a and the first inner electrode 441b, the fourth outer electrode 444a and the fourth inner electrode 444b, or the first outer electrode 441a and the fourth outer electrode 444a, or the first inner electrode 441b and the fourth inner electrode 444b are not connected through the first connection part 422a or the second connection part 422b, so that a capacitive coupling can be formed therebetween. The second electrode 442 and the third electrode 443, or the third electrode 443 and the fourth electrode 444 may also be capacitively coupled to each other.

Accordingly, the number of paths in which the capacitive coupling is formed in the sensing unit 440 increases, so that the touch sensitivity of the sensing unit 440 can be improved.

In addition, each of the first to fourth electrodes 441 to 444 may include an electrode pattern. By the electrode pattern, each of the first to fourth electrodes 441 to 444 may have a plurality of openings, and light may be emitted through the openings. In addition, the electrode patterns of the first to fourth electrodes 441 to 444 may include floating patterns 441c to 444c, respectively. The floating patterns 441c to 444c are patterns in which the electrode patterns are disconnected so that a touch driving signal or a touch sensing signal is not transmitted thereto. Since an area in which the electrode patterns are capacitively coupled to a cathode electrode, a common electrode, and the like in the display device, which are disposed below the sensing unit 440, is reduced, the influence of the voltage between the cathode electrode and the common electrode on the first to fourth electrodes 441 to 444 can be reduced.

In addition, each first connection part 422a may allow the first outer electrode 441a, the second inner electrode 442b, and the third outer electrode 443a to be connected to each other, and may allow the first outer electrode 441a, the fourth inner electrode 444b, and the third outer electrode 443a to be connected to each other. In addition, the first inner electrode 441b, the second outer electrode 442a, the third inner electrode 443b, and the fourth outer electrode 444a are extended and connected to each other by the second connection part 422b.

Accordingly, the first connection part 422a may have a shape which is bent by the second inner electrode 442b and the fourth inner electrode 444b. However, the shape of the first connection part 422a is not limited thereto.

In one embodiment a touch driving signal is provided to the first outer electrode 441a, the third outer electrode 443a, the second inner electrode 442b, and the fourth inner electrode 444b for sensing touch on the sensing unit 440. A touch sensing signal indicative of touch on the sensing unit 440 is received from the first inner electrode 441b, the third inner electrode 443b, the second outer electrode 442a, and the fourth outer electrode 444a.

Figure 5:
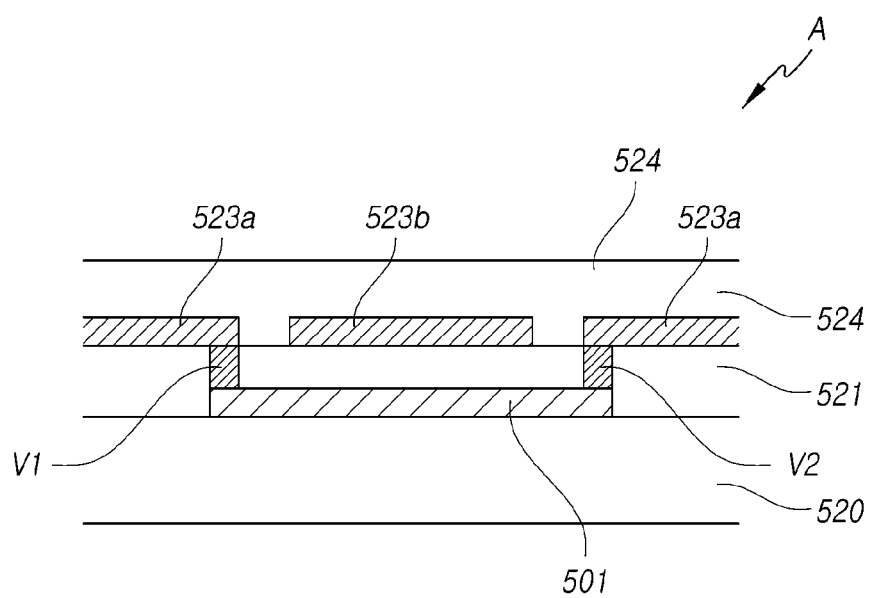
FIG. 5 is a cross-sectional view illustrating a cross section of the sensing unit of FIG. 4, which is taken along line I-I' in FIG. 4 according to the present disclosure.

FIG. 5 is a cross-sectional view illustrating a cross section of the sensing unit of FIG. 4, which is taken along line IT in FIG. 4.

Referring to FIG. 5, a first metal layer is deposited and patterned on a substrate 520, so that a first connection part 501 may be formed. At this time, the first metal layer may be deposited after a buffer layer (not illustrated) is formed on the substrate 520. Then, a first insulating film 521 may be deposited on the substrate 520 on which the first connection part 501 is formed. Via holes V1 and V2 may be formed in a portion of the first insulating film 521. The via holes V1 and V2 may reach the upper surface of the first connection part 501. In addition, a second metal layer is deposited and patterned on the first insulating film 521 so as to form the first to third electrode patterns 523a, 523b, and 523c. At this time, the first electrode pattern 523a and the third electrode pattern 523c may be connected to the first connection part 521 through the via holes V1 and V2, respectively. However, the second electrode pattern 523b is not connected to the first connection part 521. Therefore, the first connection part 501 may not be connected to the second electrode pattern 523b. In addition, the first driving electrode pattern 341a and the second driving electrode pattern 342b illustrated in FIG. 3 are connected to each other through the first connection part 501, and the first sensing electrode pattern 341b and the second sensing electrode pattern 342a may be connected to each other through the second electrode pattern 523b that is formed in a layer different from that of the first connection part 501. The different layers may be two layers separated by the first insulating film 521. Also, the second electrode pattern 523b may correspond to the second connection part.

Figure 6A:
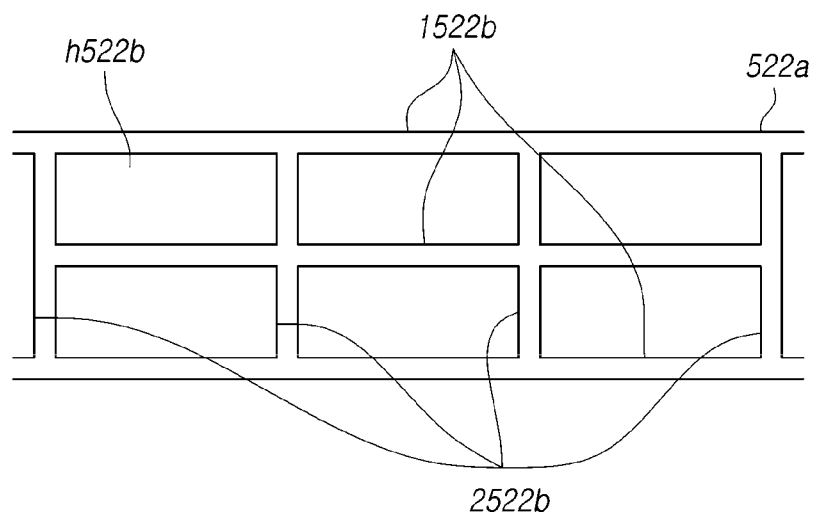
FIG. 6A is a plan view illustrating an embodiment of a first connection part illustrated in FIG. 4 according to the present disclosure.

FIG. 6A is a plan view illustrating an embodiment of a first connection part illustrated in FIG. 4.

Referring to FIG. 6A, the body of a first connection part 522a may include three horizontal wirings 1522b and four vertical wirings 2522b for connecting the three horizontal wirings 1522b, and a plurality of openings h522b may be formed between the wirings. The first connection part 522a may have a shape as illustrated by forming and patterning a metal layer on a substrate. Accordingly, since the horizontal wirings are connected through the vertical wirings, the electrical conductivity of the first connection part 522a may become higher, and may cover a certain area of the display device, so that the touch sensitivity can be improved. Although the number of horizontal wirings 1522b and the number of vertical wirings 2522b are illustrated as being three and four, respectively, the numbers of the horizontal wirings 1522b and the vertical wirings 2522b are not limited thereto. Also, the first connection part 522a is illustrated as having a "-" shape, but is not limited thereto. The first connection part may have a bent configuration to avoid the second connection part illustrated in FIG. 4.

Figure 6B:
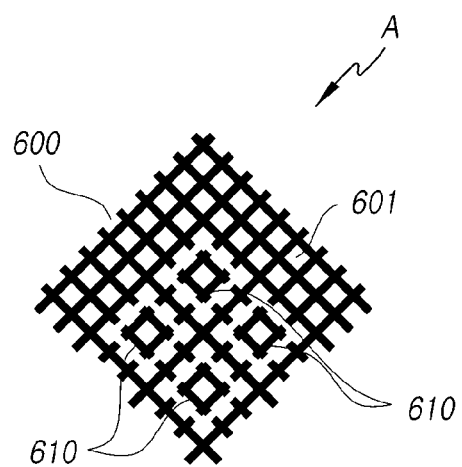
FIG. 6B is an enlarged plan view of portion "A" in the sensing unit illustrated in FIG. 4 according to the present disclosure.

FIG. 6B is an enlarged plan view of portion "A" in the sensing unit illustrated in FIG. 4.

Referring to FIG. 6B, the electrodes cause a plurality of electrode patterns 600 to intersect each other so that the electrode patterns 600 surround openings 601. Accordingly, the electrode patterns 600 may include a mesh shape. The light emitted from the display device can be transmitted to the outside through the openings 601. In addition, the electrode pattern 600 may include floating electrode patterns 610 that are disconnected from other electrodes in the region thereof.

The electrode pattern 600 may be capacitively coupled with a cathode electrode (not illustrated) or the like, which is disposed under the sensing unit in the display device. Upon being capacitively coupled with a cathode electrode, the voltage of the cathode electrode may be fluctuated by a signal flowing in the electrode pattern 600, or a signal flowing in the electrode pattern 600 may be distorted due to the change of the voltage of the cathode electrode. However, when the electrode pattern 600 includes a floating electrode pattern 610, since the floating electrode pattern 610 is not applied with voltage, the electrode pattern 600 has an area corresponding to the cathode electrode, which is reduced by the floating electrode pattern 610, and the magnitude of the capacitive coupling between the electrode pattern 600 and the cathode electrode is very small, so that it is possible to suppress the occurrence of touch malfunction or the malfunction of a display device.

In addition, each electrode of the sensing unit is formed in such a manner that the floating pattern is not present in the electrode pattern and a region in which a floating pattern is formed becomes an empty space, whereby it is also possible to reduce the magnitude of a capacitive coupling between the electrode pattern and a data line, a gate line, a power line, or the like within the display device. However, the electrode pattern is formed of a metal material, and as a result, in the region where the floating pattern is not formed, stains occurring due to light reflected from the electrode pattern may be seen. However, when the floating pattern is formed, the light reflected from all the regions becomes uniform, and as a result, stains, which may occur due to light reflected by the electrode pattern, do not appear.

Figure 7:
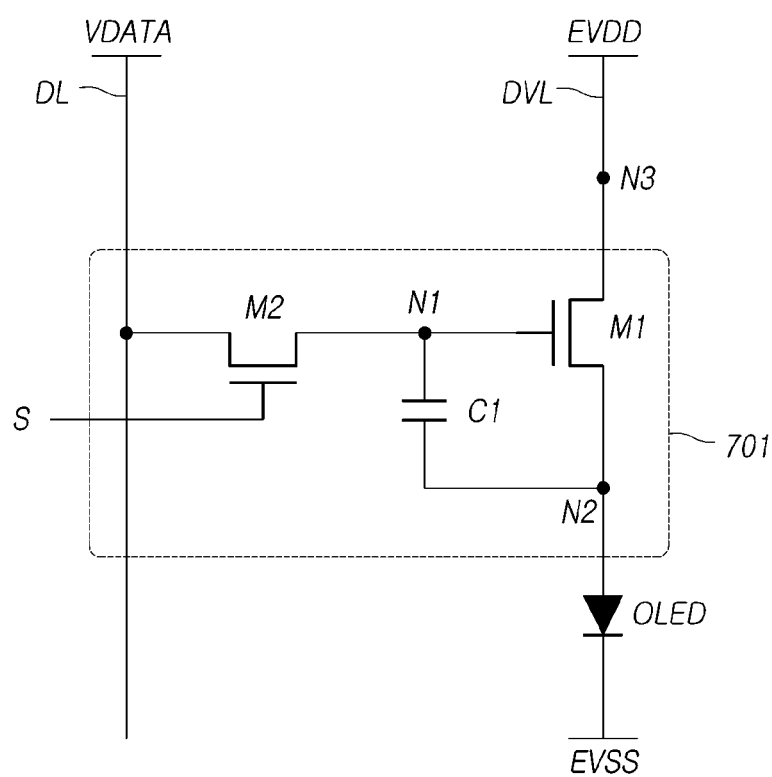
FIG. 7 is a circuit diagram illustrating an embodiment of a pixel circuit employed in the display device illustrated in FIG. 1 according to the present disclosure.

FIG. 7 is a circuit diagram illustrating a pixel structure employed in the organic light emitting display device illustrated in FIG. 1.

Referring to FIG. 7, a pixel may include an organic light emitting diode (OLED) and a pixel circuit 701. The pixel circuit 701 may include first and second transistors M1 and M2 and a capacitor C1, and may control a current flowing in the OLED. Here, the first transistor M1 may be a driving transistor that drives a current flowing in the OLED. In addition, a low potential voltage EVSS transmitted to the cathode electrode of the OLED may be grounded. However, the present invention is not limited thereto.

A first electrode of the first transistor M1 may be connected to a high potential voltage line VL, to which a high potential voltage EVDD is transmitted, a second electrode of the first transistor M1 may be connected to the anode electrode of the OLED, and the gate electrode may be connected to a first node N1. In addition, the first transistor M1 may cause the current to be driven from the first electrode to the second electrode according to a voltage difference between the first electrode and the gate electrode.

The first electrode of the second transistor M2 may be connected to a data line DL, to which a data voltage VDATA corresponding to a data signal is transmitted, the second electrode may be connected to the first node N1, and the gate electrode may be connected to a gate line S. The second transistor M2 may transmit the data voltage VDATA, which corresponds to a data signal, which is transmitted through a data line DL, to the first node N1, in response to the voltage of a gate signal, which is transmitted through the gate line S.

The capacitor C1 may be connected between the first node N1 and the second node N2 and may maintain the voltage between the first node N1 and the second node N2 so as to allow the voltage, which is applied to the gate electrode, to be maintained. When the low potential voltage EVSS transmitted to the cathode electrode of the OLED fluctuates, the voltage difference between the first node and the second node is not maintained constant, and as a result, a change may occur in the amount of current flowing in the OLED.

In each of the first transistor M1 and the second transistor M2, a first electrode may be a drain electrode, and a second electrode may be a source electrode. However, the present invention is not limited thereto. In addition, although each of the transistors is illustrated as an NMOS transistor, the transistors may be PMOS transistors without being limited thereto. Further, the pixel circuit illustrated here is merely exemplary, and the present invention is not limited thereto.

Figure 8:
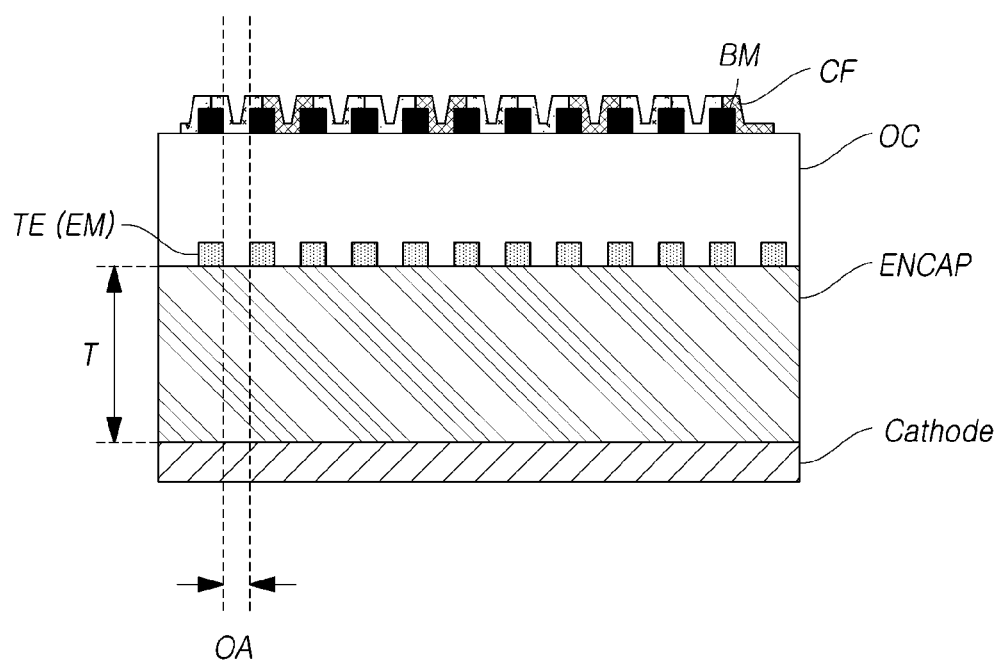
FIG. 8 is a cross-sectional view illustrating a first embodiment of the display device including the sensing unit according to the present disclosure.
Figure 9:
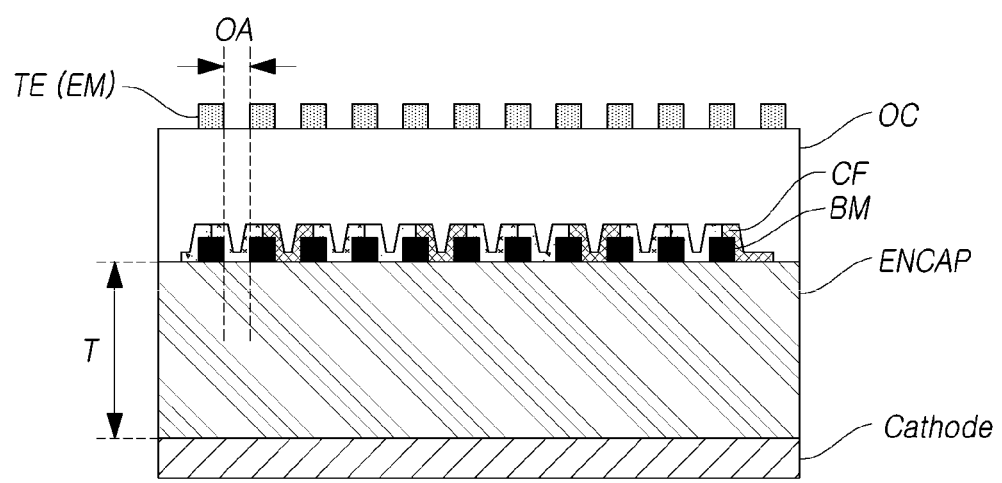
FIG. 9 is a cross-sectional view illustrating a second embodiment of the display device including the sensing unit according to the present disclosure.

FIG. 8 is a cross-sectional view illustrating a first embodiment of the display device including the sensing unit according to the present disclosure, and FIG. 9 is a cross-sectional view illustrating a second embodiment of the display device including the sensing unit according to the present disclosure.

Sensing units TE may be mounted on the display device. Here, the display device may be an OLED display device using OLEDs, and when the sensing units TE are mounted on the display device, the sensing unit may be positioned between a encapsulation layer ENCAP and a display cover COVER Also, the sensing units TE may be a plurality of electrodes and a plurality of signal lines having a plurality of electrode patterns.

Further, as illustrated in FIG. 8, the sensor units may be disposed on the encapsulation layer ENCAP, and as illustrated in FIG. 9, the sensor units TE may be disposed on the overcoat layer OC. That is, the sensor units TE may be mounted on the display device without using a separate touch panel.

Referring to FIG. 8, the sensing units TE may be formed on the encapsulation layer ENCAP, and an overcoat layer OC may be formed on the sensing units TE. In addition, a black matrix BM may be disposed on the overcoat layer OC at a position corresponding to the electrode patterns of the sensing units, and color filters CF may be disposed over the black matrix BM. A display cover (not illustrated) may be disposed on the color filters CF.

As described above, by forming the touch electrodes TE on the encapsulation layer ENCAP, the touch electrodes TE can be formed without greatly affecting the display performance and the formation of the layer for the display.

Meanwhile, in the case of a touch sensing method of a mutual-capacitance-type, there may be connection parts for connecting the driving electrodes and/or the sensing electrodes among the plurality of electrodes TE. The connection parts may be present in a layer that is different from the layer of the touch electrodes TE, with an insulating film interposed therebetween.

For the convenience of description, FIG. 8 does not illustrate the connection parts and the insulating film between the touch electrodes TE and the connection parts BP.

Meanwhile, referring to FIG. 8, a cathode of an organic light emitting diode (OLED) may exist under the encapsulation layer ENCAP.

The thickness T of the encapsulation layer ENCAP may be, for example, 5 micrometers or more.

The parasitic capacitance formed between the cathode of the OLED and the touch electrodes TE may be reduced by designing the thickness of the encapsulation layer ENCAP to be 5 micrometers or more. Thus, it is possible to prevent a deterioration in touch sensitivity due to parasitic capacitance.

On the other hand, when the touch electrodes TE are formed of a mesh-type electrode metal EM having open regions OA, the position of each of the open regions OA may correspond to one or two or more sub-pixels or to the positions of light emitting units when viewed in the vertical direction.

Therefore, as illustrated in FIG. 8, the plurality of open regions OA may correspond to the plurality of color filters CF.

As described above, in an OLED display device, it is possible to provide a display device having excellent light emitting performance by arranging the color filters CF, which are necessary in the case where white OLEDs or the like are used, to correspond to the open regions OA.

The vertical positional relationship between the color filters CF and the touch electrodes TE will now be described.

As described above, it is possible to provide a touch display device 100 having an optimal positional relationship between the color filters CF and the touch electrodes TE in consideration of display performance, such as light emitting performance and touch performance.

Meanwhile, attempts to incorporate a touch panel including touch electrodes TE in a display panel 110 have been made in order to improve manufacturing convenience of the touch display device 100 and to reduce the size of the touch display device 100.

However, there are considerable difficulties and many constraints to incorporating touch electrode in a display device. For example, during the manufacturing process of a display device there is a limit in that a high-temperature process for forming touch electrodes TE, which are generally made of a metallic material, inside a panel cannot be freely performed due to the presence of an organic material. Therefore, when the touch electrodes TE are formed on the overcoat layer OC, a high-temperature process can be performed more freely.

Referring to FIG. 9, a black matrix may be formed on the encapsulation layer ENCAP, and color filters CF may be disposed on the black matrix. The overcoat layer OC may be formed on the color filters CF. In addition, the electrode pattern of the touch electrodes TE may be disposed on the overcoat layer OC at the positions corresponding to the black matrix BM. A display cover (not illustrated) may be disposed on the color filters CF.

Meanwhile, in the case of a touch sensing method of a mutual-capacitance-type, there may be connection parts for connecting the driving electrodes and/or the sensing electrodes among the plurality of touch electrodes TE. The connection parts may be present in a layer that is different from the layer of the touch electrodes TE with an insulating film interposed therebetween.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A sensing unit that senses a touch, the sensing unit comprising:
   a first driving electrode pattern;
   a first sensing electrode pattern surrounded by the first driving electrode pattern, the first sensing electrode pattern disposed in a same layer within the sensing unit as the first driving electrode pattern;
   a second sensing electrode pattern; and
   a second driving electrode pattern surrounded by the second sensing electrode pattern, the second driving electrode pattern disposed in a same layer within the sensing unit as the second sensing electrode pattern;
   wherein a touch driving signal is provided to the first driving electrode pattern and the second driving electrode pattern for sensing touch on the sensing unit, and wherein a touch sensing signal indicative of touch on the sensing unit is received from the first sensing electrode pattern and the second sensing electrode pattern,
   wherein each of the first driving electrode pattern and the first sensing electrode pattern does not surround, or is not surrounded by, each of the second driving electrode pattern and the second sensing electrode pattern in a plan view.

2. The sensing unit of claim 1, further comprising:
   a first connection part connected to the first driving electrode pattern and the second driving electrode pattern, the first driving electrode pattern and the second driving electrode pattern electrically connected to each other through the first connection part; and
   a second connection part connected to the first sensing electrode pattern and the second sensing electrode pattern, the first sensing electrode pattern and the second sensing electrode pattern are connected to each other through the second connection part;
   wherein the first connection part and the second connection part are disposed in different layers of the sensing unit.

3. The sensing unit of claim 1, wherein each of the first driving electrode pattern and the second driving electrode pattern comprises a plurality of electrode patterns arranged in a mesh.

4. The sensing unit of claim 3, further comprising:
   a first floating electrode pattern surrounded by the first driving electrode pattern;
   a second floating electrode pattern surrounded by the second sensing electrode pattern;
   wherein the first floating electrode pattern and the second floating electrode pattern does not receive either of the touch driving signal or the sensing signal.

5. The sensing unit of claim 1, wherein the first sensing electrode pattern, the second sensing electrode pattern, the first driving electrode pattern, and the second driving electrode pattern, are disposed in a same layer of the sensing unit.

6. A sensing unit comprising:
   a first outer electrode;
   a first inner electrode surrounded by the first outer electrode, the first inner electrode pattern disposed in a same layer within the sensing unit as the first outer electrode;
   a second outer electrode;
   a second inner electrode surrounded by the second outer electrode, the second inner electrode pattern disposed in a same layer within the sensing unit as the second outer electrode;
   a third outer electrode;
   a third inner electrode surrounded by the third outer electrode, the third inner electrode pattern disposed in a same layer within the sensing unit as the third outer electrode;
   a fourth outer electrode;
   a fourth inner electrode surrounded by the fourth outer electrode, the fourth inner electrode pattern disposed in a same layer within the sensing unit as the fourth outer electrode,
   a first connection part connected to the first outer electrode, the third outer electrode, the second inner electrode, and the fourth inner electrode, the first connection part electrically connecting together the first outer electrode, the third outer electrode, the second inner electrode, and the fourth inner electrode; and
   a second connection part connected to the first inner electrode, the third inner electrode, the second outer electrode, and the fourth outer electrode, the second connection part electrically connecting together the first inner electrode, the third inner electrode, the second outer electrode, and the fourth outer electrode;
   wherein a touch driving signal is provided to the first outer electrode, the third outer electrode, the second inner electrode, and the fourth inner electrode for sensing touch on the sensing unit, and
   wherein a touch sensing signal indicative of touch on the sensing unit is received from the first inner electrode, the third inner electrode, the second outer electrode, and the fourth outer electrode.

7. The sensing unit of claim 6, wherein each of the first outer electrode, the third outer electrode, the second inner electrode, and the fourth inner electrode comprises a plurality of electrode patterns arranged in a mesh.

8. The sensing unit of claim 7, further comprising:
a first floating electrode pattern surrounded by the first outer electrode and partially surrounding the first inner electrode;
a second floating electrode pattern surrounded by the second outer electrode and partially surrounding the second inner electrode;
a third floating electrode pattern surrounded by the third outer electrode and partially surrounding the third inner electrode; and
a fourth floating electrode pattern surrounded by the fourth outer electrode and partially surrounding the fourth inner electrode;
wherein the first floating electrode pattern, the second floating electrode pattern, the third floating electrode pattern, and the fourth floating electrode patter do not receive either of the touch driving signal or the touch sensing signal.

9. The sensing unit of claim 6, wherein the sensing unit is arranged in a diamond pattern comprising a first quadrant that includes the first outer electrode and the first inner electrode, a second quadrant below the first quadrant that includes the second inner electrode and the second outer electrode, a third quadrant to the left of the first quadrant and second quadrant that includes the third inner electrode and the third outer electrode, and a fourth quadrant to the right of the first quadrant and the second quadrant that includes the fourth inner electrode and the fourth outer electrode.

10. The sensing unit of claim 9, wherein the first connection part comprises a plurality of connection lines arranged between the first quadrant, the second quadrant, the third quadrant, and the fourth quadrant of the sensing unit, each of the plurality of connection lines of the first connection part connected to a corresponding one of the first outer electrode, the third outer electrode, the second inner electrode, and the fourth inner electrode, and
wherein the second connection part comprises a plurality of connection lines arranged between the first quadrant, the second quadrant, the third quadrant, and the fourth quadrant of the sensing unit, each of the plurality of connection lines of the second connection part connected to a corresponding one of the first inner electrode, the third inner electrode, the second outer electrode, and the fourth outer electrode.

11. The sensing unit of claim of claim 6, wherein the first outer electrode, the second outer electrode, the third outer electrode, the fourth outer electrode, the first inner electrode, the second inner electrode, the third inner electrode, and the fourth inner electrode are disposed in a same layer of the sensing unit.

12. A display device comprising:
a display panel;
an encapsulation layer on the display panel;
a sensing unit mounted on the encapsulation layer, wherein the sensing unit includes:
a first driving electrode pattern;
a first sensing electrode pattern surrounded by the first driving electrode pattern, the first sensing electrode pattern disposed in a same layer within the sensing unit as the first driving electrode pattern; and
a second sensing electrode pattern;
second driving electrode pattern surrounded by the second sensing electrode pattern, the second driving electrode pattern disposed in a same layer within the sensing unit as the second sensing electrode pattern;
wherein a touch driving signal is provided to the first driving electrode pattern and the second driving electrode pattern, and wherein a touch sensing signal indicative of touch on the sensing unit is received from the first sensing electrode pattern and the second sensing electrode pattern,
wherein each of the first driving electrode pattern and the first sensing electrode pattern does not surround, or is not surrounded by, each of the second driving electrode pattern and the second sensing electrode pattern in a plan view.

13. The display device of claim 12, further comprising:
a first connection part connected to the first touch electrode and the second driving electrode, the first driving electrode pattern and the second driving electrode pattern electrically connected to each other through the first connection part; and
a second connection part connected to the first sensing electrode and the second sensing electrode, the first sensing electrode pattern and the second sensing electrode pattern are connected to each other through the second connection part;
wherein the first connection part and the second connection part are disposed in different layers of the sensing unit.

14. The display device of claim 12, wherein each of the first touch electrode and the second driving electrode comprises a plurality of electrode patterns arranged in a mesh.

15. The display device of claim 14, further comprising:
a first floating electrode pattern surrounded by the first driving electrode pattern;
a second floating electrode pattern surrounded by the second sensing electrode pattern;
wherein the first floating electrode pattern and the second floating electrode pattern does not receive either of the touch driving signal or the sensing signal.

16. The display device of claim 12, wherein the first sensing electrode pattern, the second sensing electrode pattern, the first driving electrode pattern, and the second driving electrode pattern are disposed in a same layer of the sensing unit.

17. A display device comprising:
a display panel;
an encapsulation layer on the display panel; and
a sensing unit mounted on the encapsulation layer the sensing unit including:
a first inner electrode surrounded by the first outer electrode, the first inner electrode pattern disposed in a same layer within the sensing unit as the first outer electrode;
a second outer electrode;
a second inner electrode surrounded by the second outer electrode, the second inner electrode pattern disposed in a same layer within the sensing unit as the second outer electrode;
a third outer electrode;
a third inner electrode surrounded by the third outer electrode, the third inner electrode pattern disposed in a same layer within the sensing unit as the third outer electrode;
a fourth outer electrode;

a fourth inner electrode surrounded by the fourth outer electrode, the fourth inner electrode pattern disposed in a different layer within the sensing unit as the fourth outer electrode, a first connection part connected to the first outer electrode, the third outer electrode, the second inner electrode, and the fourth inner electrode, the first connection part electrically connecting together the first outer electrode, the third outer electrode, the second inner electrode, and the fourth inner electrode; and a second connection part connected to the first inner electrode, the third inner electrode, the second outer electrode, and the fourth outer electrode, the second connection part electrically connecting together the first inner electrode, the third inner electrode, the second outer electrode, and the fourth outer electrode;

wherein a touch driving signal is provided to the first outer electrode, the third outer electrode, the second inner electrode, and the fourth inner electrode for sensing touch on the sensing unit, and wherein a touch sensing signal indicative of touch on the sensing unit is received from the first inner electrode, the third inner electrode, the second outer electrode, and the fourth outer electrode.

18. The display device of claim 17, wherein each of the first outer electrode, the third outer electrode, the second inner electrode, and the fourth inner electrode comprises a plurality of electrode patterns arranged in a mesh.

19. The display device of claim 18, further comprising:
a first floating electrode pattern surrounded by the first outer electrode and partially surrounding the first inner electrode;
a second floating electrode pattern surrounded by the second outer electrode and partially surrounding the second inner electrode;
a third floating electrode pattern surrounded by the third outer electrode and partially surrounding the third inner electrode; and
a fourth floating electrode pattern surrounded by the fourth outer electrode and partially surrounding the fourth inner electrode;
wherein the first floating electrode pattern, the second floating electrode pattern, the third floating electrode pattern, and the fourth floating electrode patter do not receive either of the touch driving signal or the touch sensing signal.

20. The display device of claim 17, wherein the sensing unit is arranged in a diamond pattern comprising a first quadrant that includes the first outer electrode and the first inner electrode, a second quadrant below the first quadrant that includes the second inner electrode and the second outer electrode, a third quadrant to the left of the first quadrant and second quadrant that includes the third inner electrode and the third outer electrode, and a fourth quadrant to the right of the first quadrant and the second quadrant that includes the fourth inner electrode and the fourth outer electrode.

21. A sensing unit that senses a touch, the sensing unit comprising:
a first driving electrode pattern;
a first sensing electrode pattern overlapped by the first driving electrode pattern, the first sensing electrode pattern disposed in a different layer within the sensing unit as the first driving electrode pattern;
a second sensing electrode pattern; and
a second driving electrode pattern overlapped by the second sensing electrode pattern, the second driving electrode pattern disposed in a different layer within the sensing unit as the second sensing electrode pattern;
wherein a touch driving signal is provided to the first driving electrode pattern and the second driving electrode pattern for sensing touch on the sensing unit, and wherein a touch sensing signal indicative of touch on the sensing unit is received from the first sensing electrode pattern and the second sensing electrode pattern;
wherein each of the first driving electrode pattern and the first sensing electrode pattern does not surround, or is not surrounded by, each of the second driving electrode pattern and the second sensing electrode pattern in a plan view.

22. The sensing unit of claim 21, wherein the first sensing electrode pattern and the second driving electrode pattern are disposed in a first layer of the sensing unit, and wherein the first driving electrode pattern and the second sensing electrode pattern are disposed in a second layer of the sensing unit that is distinct from the first layer.

23. A display device comprising:
a display panel;
an encapsulation layer on the display panel; and
a sensing unit mounted on the encapsulation layer,
wherein the sensing unit includes:
a first driving electrode pattern;
a first sensing electrode pattern overlapped by the first driving electrode pattern, the first sensing electrode pattern disposed in a different layer within the sensing unit as the first driving electrode pattern; and
a second sensing electrode pattern;
second driving electrode pattern including overlapped by the second sensing electrode pattern, the second driving electrode pattern disposed in a different layer within the sensing unit as the second sensing electrode pattern;
wherein a touch driving signal is provided to the first driving electrode pattern and the second driving electrode pattern, and wherein a touch sensing signal indicative of touch on the sensing unit is received from the first sensing electrode pattern and the second sensing electrode pattern,
wherein each of the first driving electrode pattern and the first sensing electrode pattern does not surround, or is not surrounded by, each of the second driving electrode pattern and the second sensing electrode pattern in a plan view.

24. The display device of claim 23, wherein the first sensing electrode pattern and the second driving electrode pattern are disposed in a first layer of the sensing unit, and wherein the first driving electrode pattern and the second sensing electrode pattern are disposed in a second layer of the sensing unit that is distinct from the first layer.

* * * * *